United States Patent
Chu-Kung et al.

(10) Patent No.: US 9,391,181 B2
(45) Date of Patent: Jul. 12, 2016

(54) LATTICE MISMATCHED HETERO-EPITAXIAL FILM

(71) Applicant: Intel Corporation, Santa Clara, CA (US)

(72) Inventors: Benjamin Chu-Kung, Hillsboro, OR (US); Van H. Le, Beaverton, OR (US); Robert S. Chau, Portland, OR (US); Sansaptak Dasgupta, Hillsboro, OR (US); Gilbert Dewey, Hillsboro, OR (US); Niti Goel, Austin, TX (US); Jack T. Kavalieros, Portland, OR (US); Matthew V. Metz, Portland, OR (US); Niloy Mukherjee, Beaverton, OR (US); Ravi Pillarisetty, Portland, OR (US); Willy Rachmady, Beaverton, OR (US); Marko Radosavljevic, Beaverton, OR (US); Han Wui Then, Portland, OR (US); Nancy M. Zelick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 13/723,563

(22) Filed: Dec. 21, 2012

(65) Prior Publication Data

US 2014/0175509 A1  Jun. 26, 2014

(51) Int. Cl.
*H01L 29/06* (2006.01)
*H01L 29/739* (2006.01)
(Continued)

(52) U.S. Cl.
CPC ........ *H01L 29/7391* (2013.01); *H01L 29/6625* (2013.01); *H01L 29/66242* (2013.01);
(Continued)

(58) Field of Classification Search
CPC ............ H01L 21/0262; H01L 21/0254; H01L 21/02458; H01L 21/205; H01L 29/12; H01L 29/76

USPC .......... 257/24, 183, 162, 273, 378, 557, 575, 257/E29.069, E21.103; 438/503, 507
See application file for complete search history.

(56) References Cited

U.S. PATENT DOCUMENTS 6,075,272 A * 6/2000 Forbes et al. ................. 257/378
6,803,631 B2 10/2004 Dakshina-Murthy et al.
(Continued)

OTHER PUBLICATIONS

Patent Cooperation Treaty, Notification of Transmittal of the International Search Report and the Written Opinion of the International Searching Authority mailed Sep. 30, 2013, for international application No. PCT/US2013/048115.
(Continued)

*Primary Examiner* — Fernando L Toledo
*Assistant Examiner* — Lawrence-Linh T Nguyen
(74) *Attorney, Agent, or Firm* — Trop, Pruner & Hu, P.C.

(57) ABSTRACT

An embodiment concerns forming an EPI film on a substrate where the EPI film has a different lattice constant from the substrate. The EPI film and substrate may include different materials to collectively form a hetero-epitaxial device having, for example, a Si and/or SiGe substrate and a III-V or IV film. The EPI film may be one of multiple EPI layers or films and the films may include different materials from one another and may directly contact one another. Further, the multiple EPI layers may be doped differently from another in terms of doping concentration and/or doping polarity. One embodiment includes creating a horizontally oriented hetero-epitaxial structure. Another embodiment includes a vertically oriented hetero-epitaxial structure. The hetero-epitaxial structures may include, for example, a bipolar junction transistor, heterojunction bipolar transistor, thyristor, and tunneling field effect transistor among others. Other embodiments are described herein.

14 Claims, 10 Drawing Sheets

(51) Int. Cl.
| | |
|---|---|
| H01L 29/66 | (2006.01) |
| H01L 29/732 | (2006.01) |
| H01L 29/735 | (2006.01) |
| H01L 29/737 | (2006.01) |
| H01L 29/78 | (2006.01) |
| H01L 29/74 | (2006.01) |

(52) U.S. Cl.
CPC .... *H01L29/66356* (2013.01); *H01L 29/66393* (2013.01); *H01L 29/732* (2013.01); *H01L 29/735* (2013.01); *H01L 29/737* (2013.01); *H01L 29/7371* (2013.01); *H01L 29/0676* (2013.01); *H01L 29/7436* (2013.01); *H01L 29/785* (2013.01)

(56) References Cited

U.S. PATENT DOCUMENTS

| | | | |
|---|---|---|---|
| 7,348,284 | B2 | 3/2008 | Doyle et al. |
| 7,494,911 | B2 | 2/2009 | Hudait |
| 7,560,784 | B2 * | 7/2009 | Cheng ............... H01L 29/0649 257/401 |
| 8,329,541 | B2 | 12/2012 | Ye et al. |
| 2009/0085027 | A1 * | 4/2009 | Jin ........................ B82Y 10/00 257/24 |
| 2012/0187482 | A1 | 7/2012 | Adam et al. |

OTHER PUBLICATIONS

Bohr, Mark, "Intel's Revolutionary 22 nm Transistor Technology", May 2011, 1-28.
Lochtefeld, Anthony, "Defect Reduction for Lattice Mismatched Epitaxy Via Aspect Ratio Trapping", Solid State Technology, Aug. 1, 2008, 5 pages.
Raychaudhuri, S., "Calculation of Critical Dimensions for Wurtzite and Cubic Zinc Blende Coaxial Nanowire Heterostructures", Jul./Aug. 2006, 2053-5059, B 24(4), AVS: Science & Technology of Materials, Interfaces, and Processing.
Kavanagh, Karen L., "Misfit Dislocations in Nanowire Heterostructures" Jan. 22, 2010, 1-7, Semicond. Sci. Technol. 25, IOP Publishing.
Xue, Zhongying, "Epitaxial Growth of Fully Relaxed Si0.75Ge0.25 on SOI Substrate" 2011, 5021-5024, Applied Surface Science 257.
Rehder, E. M., "Site Relaxation on Silicon-On-Insulator Substrates: An Experimental and Modeling Study", Dec. 15, 2003, 7892-7903, Journal of Applied Physics, vol. 94, No. 12.
Esfandyarpour, Rahim, "Tunneling Field Effect Transistors", Jun. 12, 2012, 6 pages.
Taiwan Patent Office, Office Action mailed Nov. 12, 2015 in Taiwanese Patent Application No. 102145592. (Redacted).
Korean Intellectual Property Office, Notice of Preliminary Rejection mailed Jan. 3, 2016, in Korean Patent Application No. 10-2015-7011744.

\* cited by examiner

LATTICE MISMATCHED HETERO-EPITAXIAL FILM

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of Si since use of a Si substrate has the additional advantage of cost reduction.

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer by relaxing the EPI film. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

In the following description, numerous specific details are set forth but embodiments of the invention may be practiced without these specific details. Well known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

A conventional technique for lattice mismatched configurations involves deposition of thick buffers (e.g., that are 0.5 or more microns thick) that bridge the lattice constant difference between the substrate and the layers of interest (device layers including III-V materials and the like). In such conventional techniques complicated anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Another conventional technique includes Aspect Ratio Trapping (ART). ART is based on threading dislocations that propagate upwards at a specific angle. In ART a trench is made with a high enough aspect ratio such that the defects terminate on the sidewall of the trench and any layer above the terminations is defect free.

An embodiment differs from the conventional methods described above and concerns forming an EPI film on a substrate where the EPI film has a different lattice constant from the substrate. The EPI film and substrate may include different materials to collectively form a hetero-epitaxial device having, for example, a Si and/or SiGe substrate and a III-V or IV film. The EPI film may be one of multiple EPI layers or films and the films may or may not include different materials from one another and may or may not directly contact one another. Further, the multiple EPI layers may be doped differently from another in terms of doping concentration and/or doping polarity. One embodiment includes creating a horizontally oriented hetero-epitaxial structure. Another embodiment includes a vertically oriented hetero-epitaxial structure. The hetero-epitaxial structures may include, for example, a bipolar junction transistor, heterojunction bipolar transistor, thyristor, and tunneling field effect transistor. Other embodiments are described herein.

As mentioned above, one embodiment includes a horizontally oriented hetero-epitaxial structure. FIGS. 1(a)-(e) and 6 are discussed in regard to a horizontally oriented hetero-epitaxial structure 100. In block 605 fin 105 is formed (FIG.

Figure 1A:
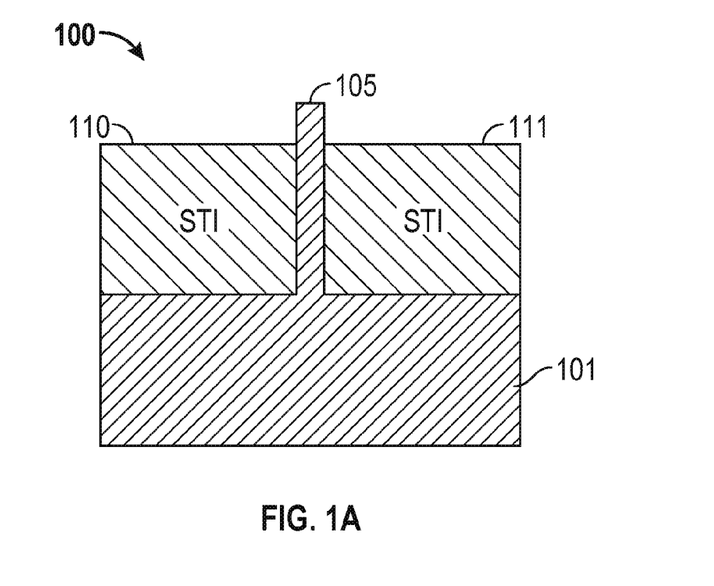
FIGS. 1(a)-(e) depict a horizontal heterostructure in an embodiment of the invention.

1(a)). Fin 105 may couple directly or indirectly to substrate 101. Fin 105 may be adjacent (directly or indirectly) shallow trench isolation (STI) portions 110, 111.

Figure 1B:
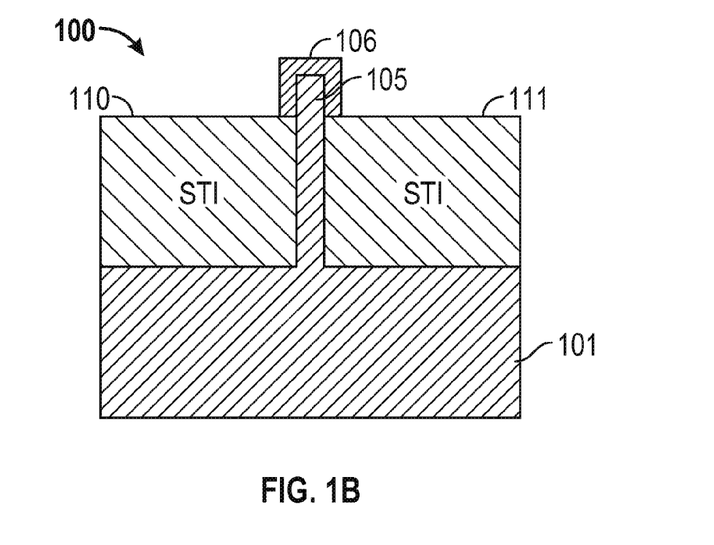
Figure 1C:
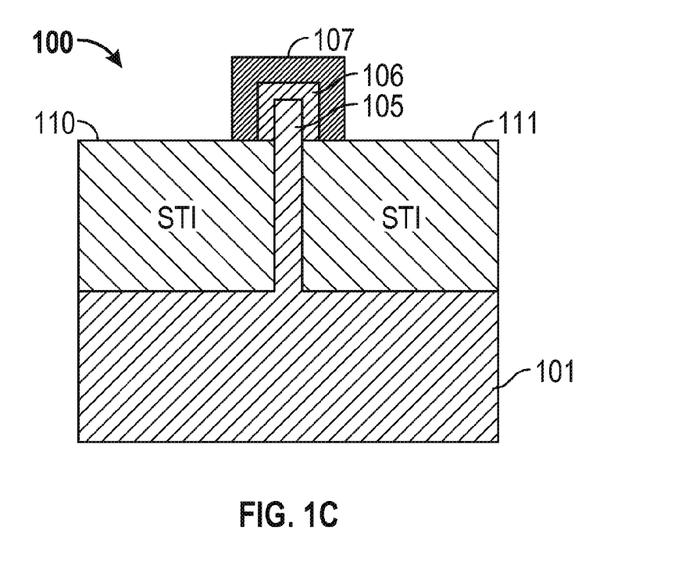

In block 610 EPI cladding layer 106 is formed on fin 105 (FIG. 1(b)). In one embodiment EPI layer 106 has a lattice constant mismatched with substrate 101 and/or fin 105. In other embodiments there is no such mismatch or the mismatch is lessened. In one embodiment layer 106 is a different material (e.g., III-V or IV) from substrate 101 (e.g., a substrate that includes Si such as Si or SiGe), but other embodiments are not so limited. In the example of FIG. 1(b) layer 106 is N doped.

A cladding layer, as used herein, is a layer that substantially covers a portion of a structure. For example, layer 106 substantially covers sidewalls and a top of fin 105 (but does not cover the bottom and possibly other sidewalls of fin 105). This distinguishes the layer from a layer such as STI 110, which is more generally formed upon substrate 101 and adjacent fin 105. There is no one particular method required to clad a structure (e.g., fin) with a cladding layer.

Figure 1D:
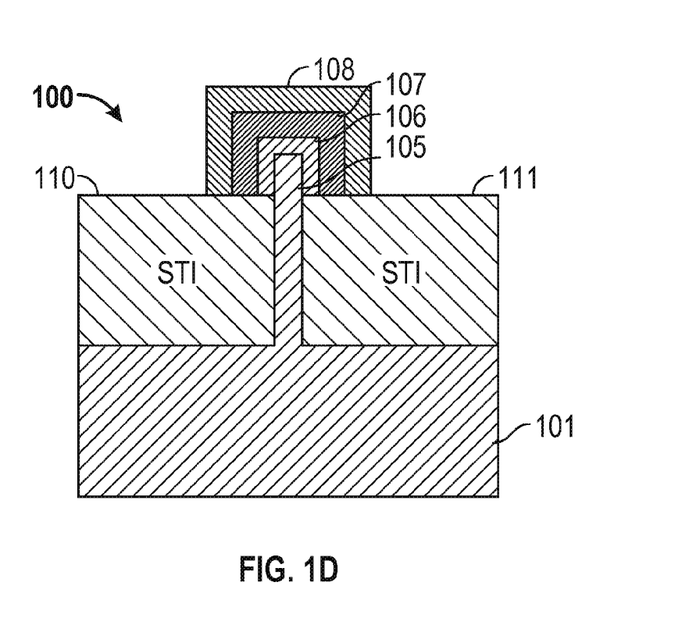

Block 615 is not included in all embodiments (see dashed lines indicating optional nature of the block). Block 615 includes forming an intrinsic semiconductor cladding layer 107 over layer 106 (FIG. 1(c)). Other embodiments skip block 615 and proceed to block 620 (FIG. 1(d)), where another EPI layer (layer 108) is formed over an outer cladding layer (e.g., layer 108 directly contacts layer 106 if block 615 is omitted or directly contacts layer 107 if block 615 is followed). In one embodiment EPI layer 108 has a lattice constant mismatched with substrate 101 and/or fin 105. In other embodiments there is no such mismatch or the mismatch is lessened. Layer 108 may have a lattice constant mismatched with layers 106 and/or 107 but in other embodiments there is no such mismatch or the mismatch is lessened. In one embodiment at least one of layers 106, 107, and 108 has a lattice mismatch with the lattice constant for substrate 101. In one embodiment layer 108 is a different material (e.g., III-V or IV) from substrate 101 (e.g., a substrate that includes Si such as Si or SiGe), but other embodiments are not so limited. In the example of FIG. 1(d) layer 106 is N doped and layer 108 is P doped (while layer 107 in instrisic), but in other embodiments any doping may be performed differently (e.g., layer 106 is P doped and layer 108 is N doped).

Figure 1E:
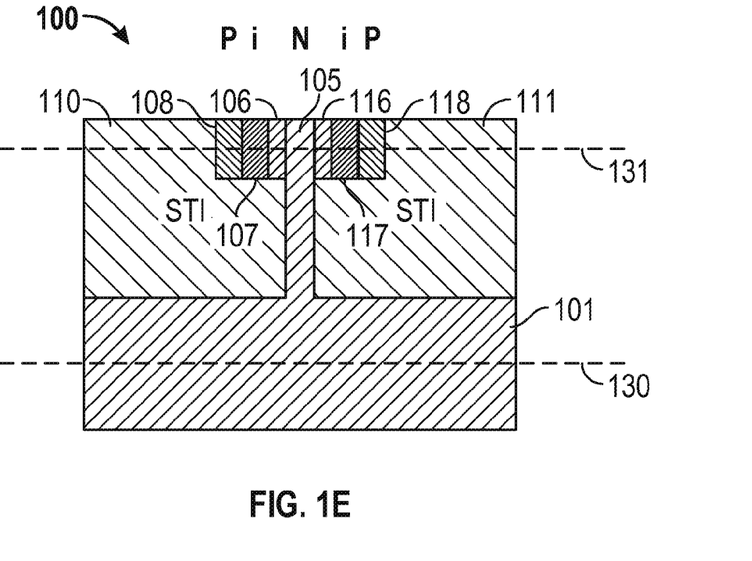

In block 625 (FIG. 1(e)) portions of EPI layers 106, 107, 108 are removed to reveal portions 106 and 116 (both N doped), 107 and 117 (both intrinsic), and 108 and 118 (both P doped). For example, STI 110, 111 is increased and the top of EPI layers 106, 107, 108 are polished back. The foreground and background of FIG. 1(e) that is not shown may be removed so that in one embodiment fin 105 fully and completely separates layers 106 and 116 (e.g., layers 106 and 116 do not reach each other by wrapping around fin 105). In other embodiments, layer 106 is not removed to the point of fin 105 so there may still be a portion of layer 106 atop fin 105. In other embodiments, fin 105 is exposed and, in some embodiments, removed leaving a trench that is left open or filled with, for example, oxide. If fin 105 is strained and starting to form defects the defects may form a leakage path that will degrade device performance. Thus, fin 105 may be removed to lessen the leakage current. Also, regardless of the quality of the silicon, leaving the fin in may worsen electrostatics and thus a fin may be removed where electrostatics are a concern.

In one embodiment, in between forming the innermost and outermost cladding layer, an anneal may be done to change the lattice constant of any annealed cladding layers and the substrate (e.g., to make all annealed cladding layers and the substrate have the same lattice constant or to lessen the mismatch between any of the layers).

After the cladding layers are exposed to access each P, I, and N layer, contacts (e.g., metal contacts) may be coupled to the P, I, and N regions and the basic structure of a horizontal P-i-N or N-i-P heterostructure is present. If a single P-i-N area is desired then areas 108, 107, 106, for example, may be preserved and areas 116, 117, 118 may be removed. However, in other embodiments (such as FIG. 1(e)) provide two separate P-i-N devices (e.g., one device using layers 108, 107, 106 and one device using layers 116, 117, 118). In other embodiments FIG. 1(e) may be used for, as an example, a horizontal bipolar junction transistor (P-N-P or N-P-N), a horizontal heterojunction bipolar transistor (P-N-P or N-P-N), a thyristor, and the like. For example, a P-N-P device may be formed from 108 for a P portion, 106 and/or 116 for the N portion, and 118 for the other P portion. Thus, a horizontal heteroepitaxial device includes doped portions in plane 131, parallel to long axis 130 of substrate 101. Portions 107, 117 are optional and may not be included. In such a case, an embodiment may have layer 108 directly contact layer 106 and layer 116 directly contact layer 118. Further, depending on the amount of layer 106 removed layers 106 and 116 may be monolithic (i.e., embodiments include layers 106, 116 completely disconnected from one another while other embodiments have the layers directly connected). Thus, in one embodiment cladding layers determine the p-doped, intrinsic, and n-doped regions of hetero-EPI devices.

Figure 2A:
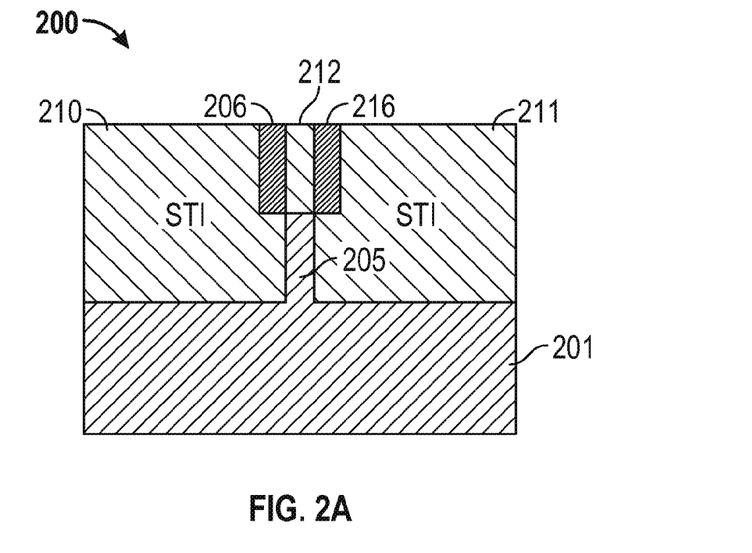
FIGS. 2(a)-(c) depict a vertical heterostructure in an embodiment of the invention.

As mentioned above, one embodiment includes a vertically oriented hetero-epitaxial structure. FIGS. 2(a)-(c) and 7 are discussed in regard to a vertically oriented hetero-epitaxial structure 200. Block 705 includes fin formation and block 710 includes forming an EPI cladding layer on the fin. FIG. 2(a) is analogous to FIG. 1(b) described above in that a fin was formed and then clad with a cladding layer. However, FIG. 2(a) shows an embodiment where no subsequent cladding layers were added and fin 205 was partially removed and replaced with STI (see block 715 and block 720 where block 720 is optional). Thus, FIG. 2(a) shows EPI portions 206, 216 (both from an original cladding layer that covered the top of fin 205) adjacent what is left of fin 205, which extends towards and contacts substrate 201 (e.g., Si, SiGe, and the like). As used herein, EPI portions 206, 216 may be considered to be included in trenches formed in STI portions 210, 211, 212.

Figure 2B:
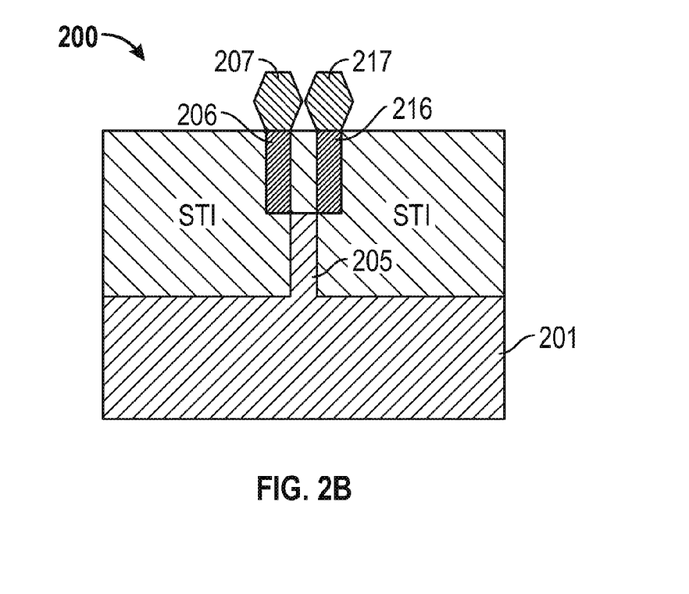

Block 725 includes forming EPI layer 207 on EPI layer 206 and EPI layer 217 on EPI layer 216 (FIG. 2(b)). The top of EPI layers 207, 217 are now the height of the "new" EPI fins (e.g., an EPI fin includes layers 216, 217) and can continue being processed into, for example, a transistor. In an embodiment layers 216 and 217 (and 206 and 207) may have different bandgaps from one another. For the embodiment of FIG. 2(b) layer 216 may have a higher bandgap than layer 217 to manage/decrease sub-fin leakage current. For example, layer 217 may include InGaAs and layer 216 may include InAlAs.

Figure 2C:
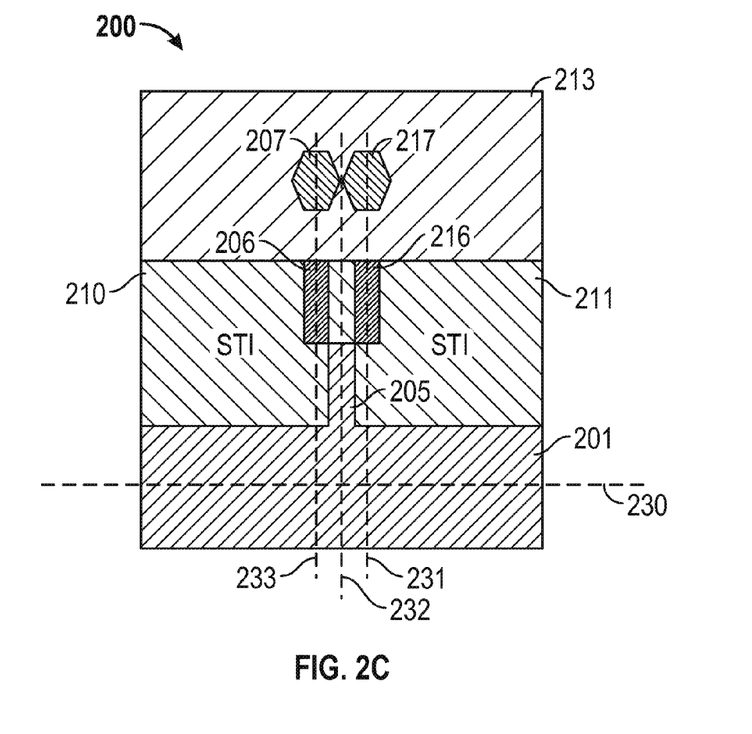

In addition, in optional block 730 a portion of EPI layers 206, 216 (and/or layers 207, 217) is removed to separate layers 216, 217 from layers 206, 207 (FIG. 2(c)), which are now included in oxide 213. This may occur during replacement of a dummy gate when access is provided to the layers that will be removed (fully or partially). As a result, nanowires 207, 217 are formed. As another result, nanowires 206, 216 may be formed. Further, fin 205 includes long axis 232 that is parallel to long axes 231, 233 of the EPI layer filled trenches and orthogonal to long axis 230 of substrate 201.

In one embodiment EPI layers 207, 217 may have equal lattice constants. The lattice constants may be mismatched with substrate 201 and/or fin 205. In other embodiments there is no such mismatch or the mismatch is lessened. In one embodiment EPI layers 207, 217 may have lattice constants mismatched with EPI layers 206, 216. In other embodiments there is no such mismatch or the mismatch is lessened. In one embodiment EPI layers 207, 217 have lattice constants mismatched with EPI layers 206, 216 and layer 201. In one embodiment layers 207, 217 are a different material (e.g., III-V or IV) from substrate 201 (e.g., a substrate that includes Si such as Si or SiGe), but other embodiments are not so limited. In one embodiment layers 207, 217 are a different material (e.g., III-V or IV) from substrate EPI layers 206, 216 (e.g., layers 207, 217 and layers 206, 216 are different III-V or IV materials). In one embodiment layers 207, 217 are a differently doped (e.g., concentration, polarity) from layers 206, 216.

Figure 3A:
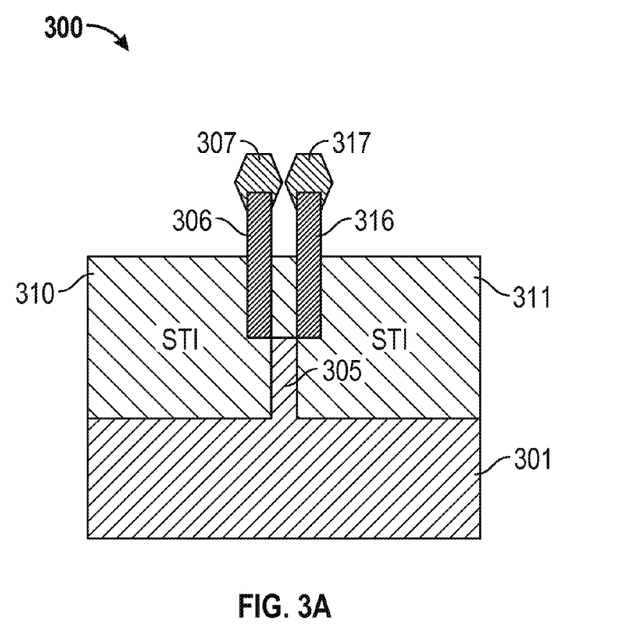
FIGS. 3(a)-(b) depict a vertical heterostructure in an embodiment of the invention.
Figure 3B:
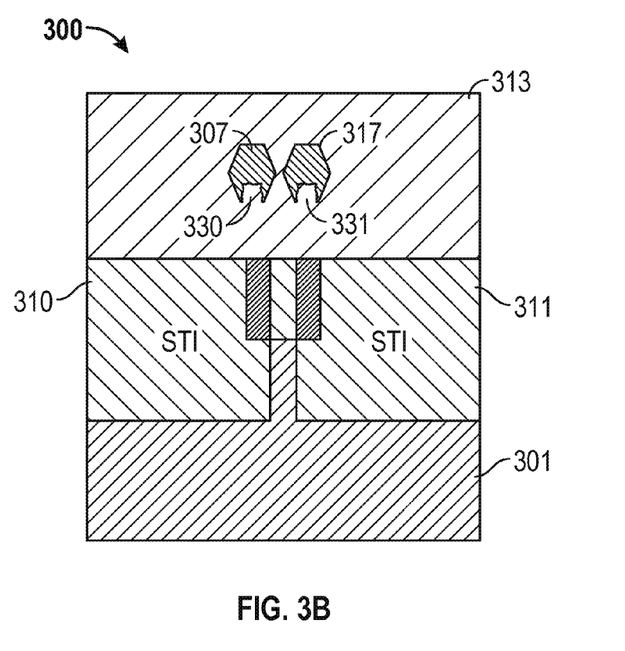

FIGS. 3(*a*)-(*b*) depict an embodiment of vertically oriented hetero-epitaxial structure 300. FIG. 3(*a*) is formed in a manner similar to that leading to FIG. 2(*b*). However, FIG. 3(*a*) depicts STI portions 310, 311 removed to a level just below the tops of EPI layers 306, 316. Layers 307, 317 now have greater access to sidewall portions of layers 306, 316 and may thus cover the tops and the sidewalls of layers 306, 316.

FIG. 3(*b*) is formed in a manner similar to FIG. 2(*c*). However, FIG. 3(*b*) depicts recesses 330, 331 included in layers 307, 317. Recesses 330, 331 represent voids left when portions of the EPI layers 306, 316 were removed. These voids (which may be filled with oxide 313) have sidewalls that correspond to sidewall portions of layers 306, 316 that were covered by cladding material layers 307, 317. Voids 330, 331 also have tops that coincide with the top portions of layers 306, 316 that were clad with cladding material layers 307, 317.

Figure 4A:
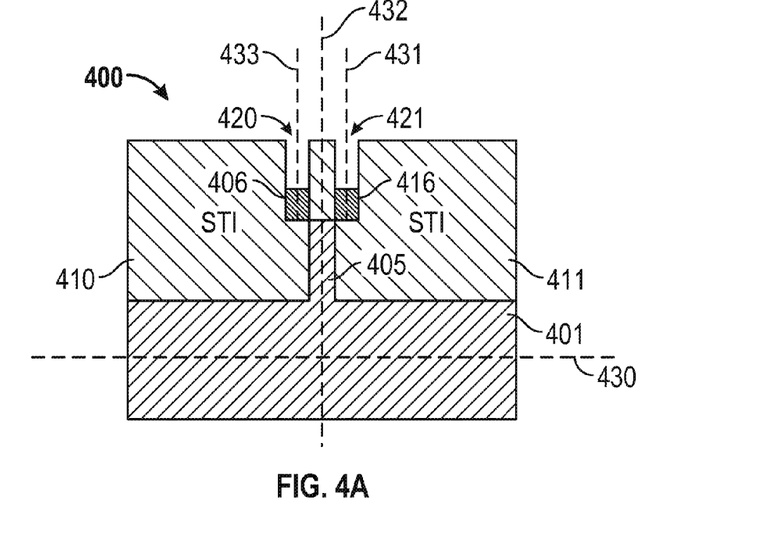
FIGS. 4(a)-(b) depict a vertical heterostructure in an embodiment of the invention.
Figure 4B:
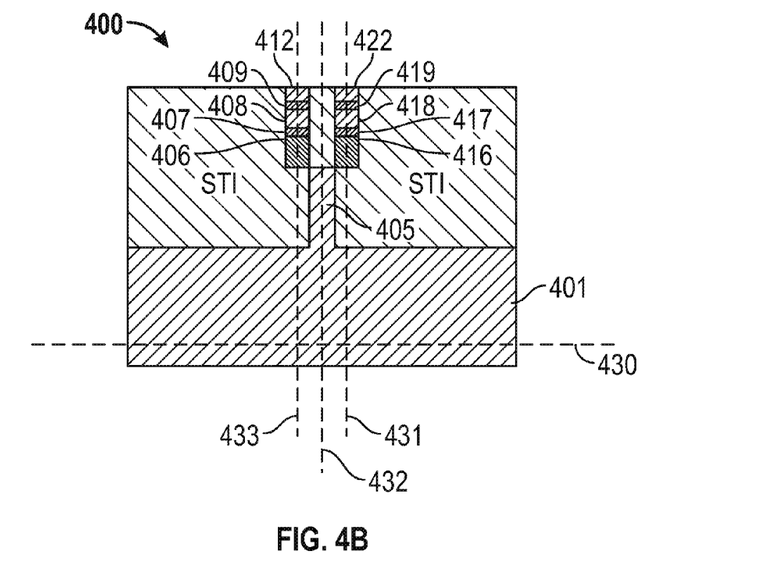
Figure 8:
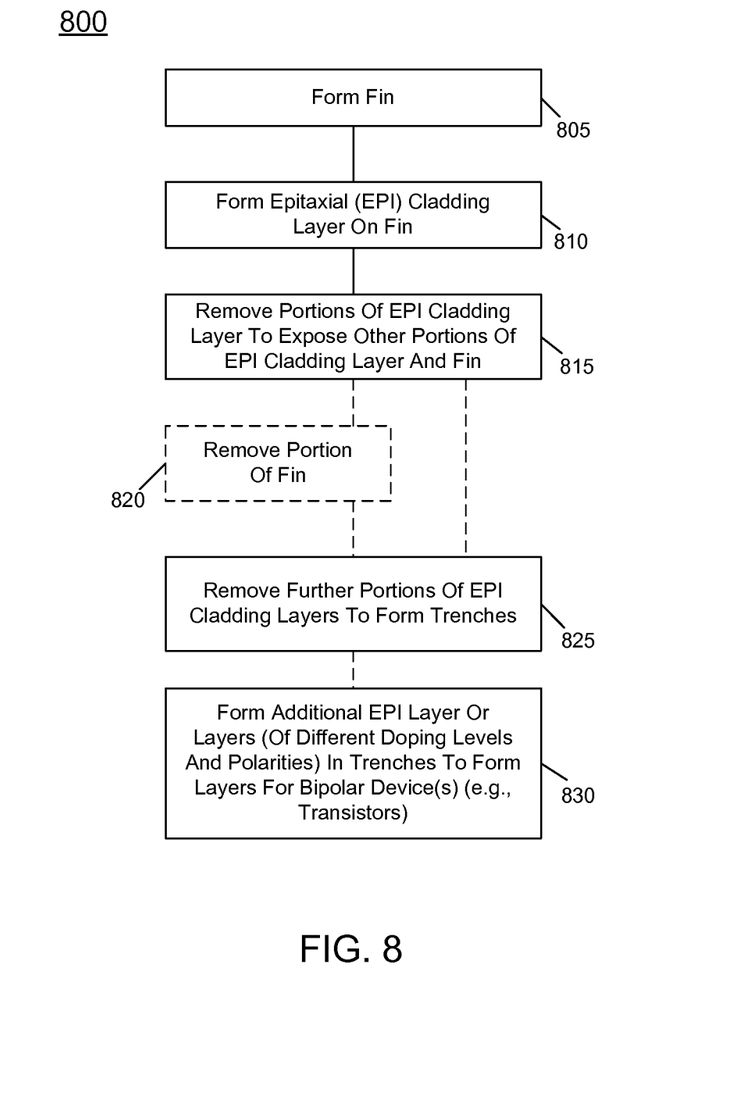
FIG. 8 includes a vertical heterostructure related method in an embodiment of the invention.

FIGS. 4(*a*)-(*b*) depict another embodiment of a vertical heterostructure. Here, however, elements of the vertical hetero-epitaxial structure are formed inside trench areas vacated by cladding layer portions. FIGS. 4(*a*)-(*b*) and 8 are discussed in regard to forming vertical heterostructure 400.

Blocks 805, 810, 815, 820 are analogous to Blocks 705, 710, 715, 720 and are not discussed again for the sake of brevity. FIG. 4(*a*) is similar to FIG. 2(*a*) considering fin 405 directly connects to substrate 401 and is adjacent STI portions 410, 411. Further, fin 405 includes long axis 432 that is parallel to long axes 431, 433 of the EPI layer filled trenches and orthogonal to long axis 430 of substrate 401. However, FIG. 4(*b*) differs from FIG. 2(*a*) considering portions of EPI layers 406, 416 have been removed to form voids 420, 421 (Block 825). FIG. 4(*b*) depicts how EPI layers 407, 417 are formed on EPI layers 406, 416; followed by EPI layers 408, 418 being formed on EPI layers 407, 417; followed by EPI layers 409, 419 being formed on EPI layers 408, 418; followed by EPI layers 412, 422 being formed on EPI layers 409, 419, and so on (Block 830).

EPI layers 407, 408, 409, 412, 417, 418, 419, and 422 are grown on top of seed layers 406, 416 to create, for example multiple nanowires. In such an embodiment EPI layer 418 may be a III-V or IV material serving as a transistor channel while layers 417, 419 are sacrificial layers to be removed, replaced with oxide, and form a nanowire from layer 418. In another embodiment EPI layers 407, 408, 409, 412, 417, 418, 419, 422 (or some subset of these layers) may be used to form vertical devices such as vertical bipolar transistors, vertical heterojunction bipolar transistors, or thyristors. For example, EPI layers 408, 418, 412, 422 may be P doped and layers 406, 416, 407, 417, 409, 419 may be N doped. Doing so allows for, as an example, an N-P-N device formed from layers 417 (N)-418 (P)-419 (N). Other layers may be doped in other variations such as only including layers 416, 417, 418 (and not including layers 419, 422) to form a P-N-P device. Furthermore, the layers may be doped with unequal doping concentrations so that the above example may be doped with, for example, 417 (N+)-418 (P+)-419 (N++) such that layers 417, 419 may be formed of the same material, doped with the same polarity, but doped with different concentrations.

In one embodiment EPI layers 407, 408, 409, 412, 417, 418, 419, 422 may have equal lattice constants or differing lattice constants. Some or all of EPI layers 407, 408, 409, 412, 417, 418, 419, 422 may have lattice constants mismatched with substrate 401 and/or fin 405. In other embodiments there is no such mismatch or the mismatch is lessened.

Figure 5:
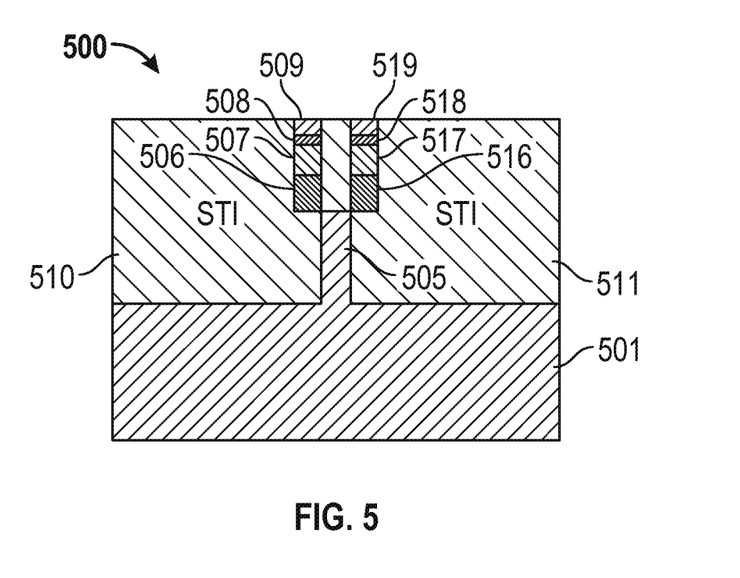
FIG. 5 depicts a vertical heterostructure in an embodiment of the invention.
Figure 6:
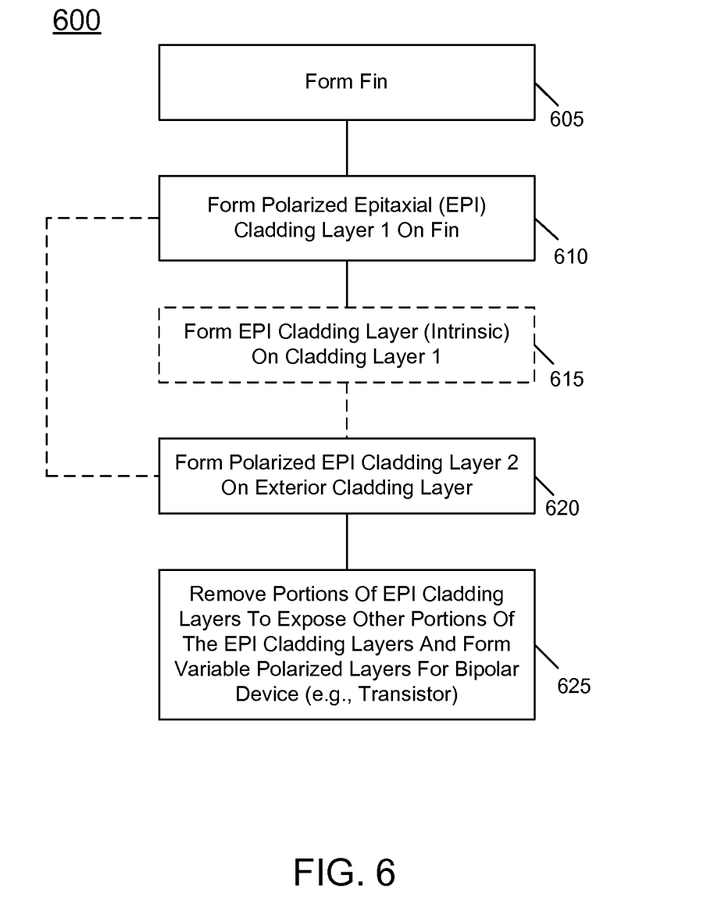
FIG. 6 includes a horizontal heterostructure related method in an embodiment of the invention.
Figure 7:
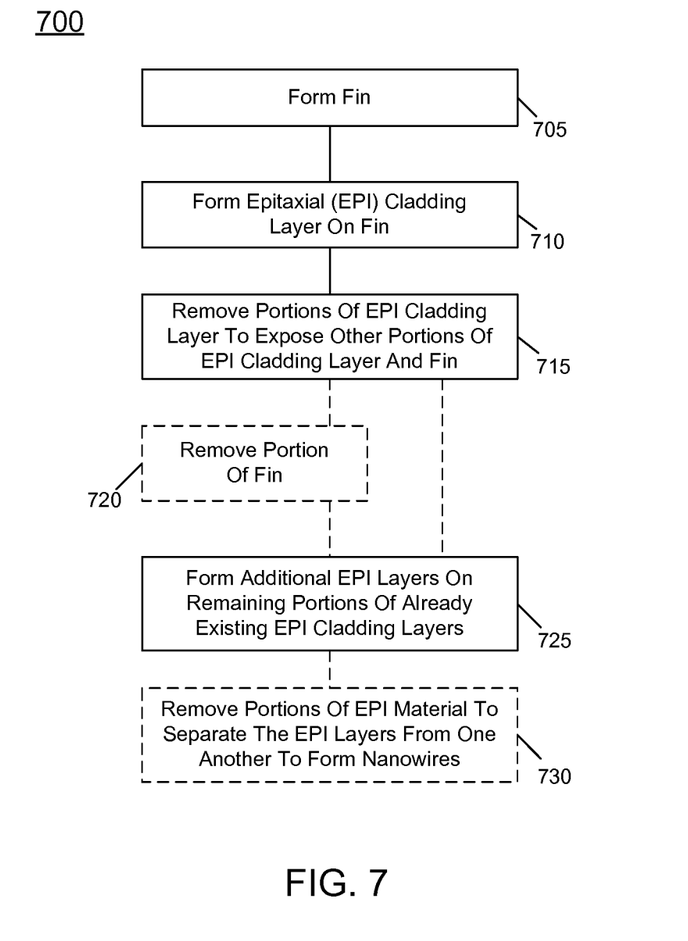
FIG. 7 includes a vertical heterostructure related method in an embodiment of the invention.

FIG. 5 depicts an embodiment for a tunneling field effect transistor 500 with trenches filled with various EPI layers, as detailed with FIGS. 4(*a*)-(*b*) and 8. Thus, fin 505 directly connects to substrate 501 and is adjacent STI portions 510, 511. EPI layers 506, 507, 508, 509, 516, 517, 518, 519 are included (illustrating how embodiments are not restricted to any set number of EPI layers). Layers 509, 519 may be P doped (or N doped in other embodiments), layers 508, 518 may be a pocket material to enhance tunneling, layers 507, 517 may be an intrinsic channel material, and layers 506, 516 may be N doped (or P doped in other embodiments when other embodiments have layers 509, 519 N doped) to form P-i-N junctions (or N-i-P junctions in other embodiments). A pocket is a thin, heavily doped, and possibly lattice mismatched material (as compared to, for example, the substrate) used to enhance tunneling and is included in some embodiments but not in others.

Thus, various embodiments address heterostructures (e.g., nanowires, bipolar junction transistors, heterojunction bipolar transistors, thyristors, tunneling transistors, and the like) with one or more EPI layer lattice constants unequal to the substrate lattice constant. Various embodiments form these heterostructures by forming, at some point in the formation process, EPI material directly above a fin (e.g., Si or SiGe) or attached to the fin using the fin as a template. The EPI layers may have portions of non-symmetry where the fin used to be (e.g., voids 330, 331 of FIG. 3(*b*)). In certain embodiments (e.g., FIG. 1(*e*)) the fin may be there (or may have been removed) and various EPI layers (e.g., layers 108, 118) may be equidistant from the fin (or the trench left by the vacated fin and possibly filled with oxide and the like).

In some embodiments the fin reaches the substrate but not so in other embodiments. In some embodiments EPI layers (e.g., layers 418, 422) may include unequal materials such as layer 418 having $In_xAl_yAs_{1-x-y}$ and layer 422 having $In_xAl_zAs_{1-x-z}$ where z is unequal to y.

In an embodiment an apparatus comprises: a substrate included in a plane having a substrate major axis corresponding to substrate width and a substrate minor axis corresponding to substrate height; and a first EPI cladding layer adjacent second and third EPI cladding layers, the first, second, and third EPI claddings layers included in a plane, the plane including a planar major axis generally parallel to the substrate major axis and intersecting the first, second, and third EPI claddings layers; wherein the substrate includes a substrate lattice constant and one of the first, second, and third cladding layers includes a lattice constant unequal to the substrate lattice constant. In an embodiment the first EPI cladding layer includes opposing sidewalls, one of the sidewalls directly contacts the second EPI cladding layer, and another of the sidewalls directly contacts the third EPI cladding layer. In an embodiment the third EPI cladding layer includes a third EPI cladding material equal to the second EPI cladding material. In an embodiment the first EPI cladding layer is doped with a polarity and the second and third EPI cladding layers are doped with another polarity opposite the polarity of the first EPI cladding layer. In an embodiment the first, second, and third EPI cladding layers are included in one of a bipolar junction transistor, heterojunction bipolar transistor, and a thyristor. In an embodiment the second and third EPI cladding layers are equidistant from one of (a) a fin that extends towards the substrate, and (b) a trench that extends towards the substrate. In an embodiment utilizing a silicon on insulator (SOI) the substrate may be construed to include the thin silicon layer above the insulator. In an embodiment the first and second EPI cladding layers directly contact opposing sidewalls of an intrinsic EPI cladding layer and the first and third EPI cladding layers directly contact opposing sidewalls of another intrinsic EPI cladding layer. An embodiment includes a fourth EPI cladding layer including a fourth EPI cladding material equal to the first EPI cladding material, wherein the fourth EPI cladding layer is included in the plane, is located between the first and third EPI cladding layers, and has a doping concentration and a polarity both equal to the first EPI cladding layer. In an embodiment the first and fourth EPI cladding layers are equidistant from one of a fin that extends towards the substrate and a trench that extends towards the substrate. In an embodiment the first EPI cladding layer includes a first EPI cladding material and the second EPI cladding layer includes a second EPI cladding material unequal to the first EPI cladding material.

In an embodiment an apparatus comprises: a substrate included in a plane having a substrate major axis corresponding to substrate width and a substrate minor axis corresponding to substrate height; first and second EPI layers included in a first trench, the first trench having a first trench major axis, corresponding to first trench height, that is generally parallel to the substrate minor axis; and a second trench having a second trench major axis, corresponding to second trench height, that is generally parallel to the substrate minor axis and that does not intersect the first trench; wherein the substrate includes a substrate lattice constant and one of the first and second EPI layers includes a lattice constant unequal to the substrate lattice constant. In an embodiment a third EPI layer included in the first trench; wherein the second EPI layer directly contacts a top of the first EPI layer and a bottom of the third EPI layer. In an embodiment the second and third EPI layers include different materials. In an embodiment the second EPI layer is doped with a polarity and the first and third EPI layers are doped with another polarity opposite the polarity of the second EPI layer. In an embodiment the first and third EPI layers have different doping concentrations from one another. In an embodiment the first and second EPI layers are included in one of a bipolar junction transistor, heterojunction bipolar transistor, a thyristor, and a tunneling field effect transistor. An embodiment includes third and fourth EPI layers included in a third trench, the third trench having a third trench major axis, corresponding to third trench height, that is generally parallel to the substrate minor axis and that does not intersect the second trench; wherein the first, second, third and fourth EPI layers are each included in one of a bipolar junction transistor, heterojunction bipolar transistor, a thyristor, and a tunneling field effect transistor; wherein the first and third trenches are equidistant from the second trench.

In an embodiment an apparatus comprises: a substrate, having a substrate lattice constant, included in a plane having a substrate major axis corresponding to substrate width and a substrate minor axis corresponding to substrate height; a first trench including a first trench major axis, corresponding to first trench height, that is generally parallel to the substrate minor axis; a second trench having a second trench major axis, corresponding to second trench height, that is generally parallel to the substrate minor axis and that does not intersect the first trench; a first EPI layer included in the first trench; a second EPI layer, including a second EPI layer bottom and opposing sidewall portions, intersecting the first trench major axis; wherein one of the first and second EPI layers includes a lattice constant unequal to the substrate lattice constant. An embodiment comprises: an additional trench including an additional trench major axis, corresponding to additional trench height, that is generally parallel to the substrate minor axis; an additional EPI layer, having a lattice constant equal to the lattice constant of the first EPI layer, included in the additional trench; and another EPI layer, having a lattice constant equal to the lattice constant of the second EPI layer, intersecting the additional trench major axis wherein the first trench and the additional trench are equidistant from the second trench. In an embodiment the first and second EPI layers have unequal bandgaps. In an embodiment the second EPI layer comprises a bottom portion that includes a recess. In an embodiment the second trench includes a fin.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a substrate included in a plane having a substrate major axis corresponding to substrate width and a substrate minor axis corresponding to substrate height; and
    a first epitaxial (EPI) cladding layer adjacent second and third EPI cladding layers, the first, second, and third EPI claddings layers included in a plane, the plane including a planar major axis generally parallel to the substrate major axis and intersecting the first, second, and third EPI claddings layers;
    wherein the substrate includes a substrate lattice constant and one of the first, second, and third cladding layers includes a lattice constant unequal to the substrate lattice constant;
    wherein the third EPI cladding layer includes a third EPI cladding material equal to a second EPI cladding material;
    wherein the first EPI cladding layer is doped with a polarity and the second and third EPI cladding layers are doped with another polarity opposite the polarity of the first EPI cladding layer;
    wherein the second and third EPI cladding layers are equidistant from one of (a) a fin that extends towards the substrate, and (b) a trench that extends towards the substrate.

2. The apparatus of claim 1, wherein the first, second, and third EPI cladding layers are included in one of a bipolar junction transistor, heterojunction bipolar transistor, and a thyristor.

3. The apparatus of claim 1, wherein the first and second EPI cladding layers directly contact opposing sidewalls of an intrinsic EPI cladding layer and the first and third EPI cladding layers directly contact opposing sidewalls of another intrinsic EPI cladding layer.

4. The apparatus of claim 1, wherein the first EPI cladding layer includes a first EPI cladding material and the second EPI cladding layer includes the second EPI cladding material which is unequal to the first EPI cladding material.

5. The apparatus of claim 1, wherein the second and third EPI cladding layers are not monolithic with each other and the first EPI cladding layer is not monolithic with either of the second and third EPI cladding layers.

6. The apparatus of claim 1, wherein the first EPI cladding layer is between the second and third EPI cladding layers.

7. An apparatus comprising:
- a substrate included in a plane having a substrate major axis corresponding to substrate width and a substrate minor axis corresponding to substrate height; and
- a first epitaxial (EPI) cladding layer adjacent second and third EPI cladding layers, the first, second, and third EPI claddings layers included in a plane, the plane including a planar major axis generally parallel to the substrate major axis and intersecting the first, second, and third EPI claddings layers;
- wherein the substrate includes a substrate lattice constant and one of the first, second, and third cladding layers includes a lattice constant unequal to the substrate lattice constant
- wherein the second and third EPI cladding layers are equidistant from one of (a) a fin that extends towards the substrate, and (b) a trench that extends towards the substrate.

8. The apparatus of claim 7, wherein the third EPI cladding layer includes a third EPI cladding material equal to a second EPI cladding material.

9. The apparatus of claim 7, wherein the first EPI cladding layer is doped with a polarity and the second and third EPI cladding layers are doped with another polarity opposite the polarity of the first EPI cladding layer.

10. The apparatus of claim 7, wherein the first, second, and third EPI cladding layers are included in one of a bipolar junction transistor, heterojunction bipolar transistor, and a thyristor.

11. The apparatus of claim 7, wherein the first and second EPI cladding layers directly contact opposing sidewalls of an intrinsic EPI cladding layer and the first and third EPI cladding layers directly contact opposing sidewalls of another intrinsic EPI cladding layer.

12. The apparatus of claim 7, wherein the first EPI cladding layer includes a first EPI cladding material and the second EPI cladding layer includes a second EPI cladding material unequal to the first EPI cladding material.

13. The apparatus of claim 7, wherein the second and third EPI cladding layers are not monolithic with each other and the first EPI cladding layer is not monolithic with either of the second and third EPI cladding layers.

14. The apparatus of claim 7, wherein the first EPI cladding layer is between the second and third EPI cladding layers.

* * * * *